(12) United States Patent
Jones et al.

(10) Patent No.: US 7,099,151 B2
(45) Date of Patent: Aug. 29, 2006

(54) MODULAR COMPUTER SYSTEM AND COMPONENTS THEREFOR

(76) Inventors: John R. Jones, 16211 N. Scottsdale Rd. Suite 191, Scottsdale, AZ (US) 85254; Diane M. Heppting, 8228 Horseshoe Bend La., Las Vegas, NV (US) 89113

( * ) Notice: Subject to any disclaimer, the term of this patent is extended or adjusted under 35 U.S.C. 154(b) by 71 days.

(21) Appl. No.: 10/486,053

(22) PCT Filed: Aug. 12, 2003

(86) PCT No.: PCT/US03/25339

§ 371 (c)(1),
(2), (4) Date: Feb. 6, 2004

(87) PCT Pub. No.: WO2004/015554

PCT Pub. Date: Feb. 19, 2004

(65) Prior Publication Data

US 2004/0184242 A1 Sep. 23, 2004

Related U.S. Application Data

(60) Provisional application No. 60/402,736, filed on Aug. 12, 2002.

(51) Int. Cl.
*G06F 1/18* (2006.01)
*H05K 5/00* (2006.01)

(52) U.S. Cl. ........................ 361/686; 710/303

(58) Field of Classification Search ........ 361/724–727, 361/686; 312/223.1, 223.2, 292; 710/303, 710/304

See application file for complete search history.

(56) References Cited

U.S. PATENT DOCUMENTS

| | | | |
|---|---|---|---|
| 5,227,957 A | * | 7/1993 | Deters ...................... 361/686 |
| 5,301,346 A | | 4/1994 | Notarianni et al. |
| 5,372,515 A | | 12/1994 | Miller et al. |
| 5,392,197 A | | 2/1995 | Cuntz et al. |
| 5,408,383 A | | 4/1995 | Nagasaka et al. |
| 5,457,601 A | | 10/1995 | Georgopulos et al. |
| 5,506,373 A | | 4/1996 | Hoffman |
| 5,608,607 A | | 3/1997 | Dittmer |
| 5,808,672 A | | 9/1998 | Wakabayashi et al. |
| 5,820,414 A | | 10/1998 | Omori |
| 5,823,796 A | | 10/1998 | Bethurum |
| 5,909,357 A | | 6/1999 | Orr |
| 5,984,731 A | | 11/1999 | Laity |
| 6,073,333 A | | 6/2000 | Orr |
| 6,094,360 A | | 7/2000 | Lange et al. |
| 6,118,663 A | * | 9/2000 | Fan ............................ 361/686 |
| 6,122,175 A | | 9/2000 | Shieh |
| 6,141,221 A | | 10/2000 | Tong et al. |
| 6,181,574 B1 | | 1/2001 | Loibl |
| 6,219,229 B1 | * | 4/2001 | Lee ............................ 361/724 |
| 6,333,860 B1 | | 12/2001 | Oliphant et al. |
| 6,339,531 B1 | | 1/2002 | McKain et al. |
| 6,346,000 B1 | | 2/2002 | Orr |
| 6,353,535 B1 | | 3/2002 | Yoshida |
| 6,424,525 B1 | * | 7/2002 | MacLeod et al. ........... 361/686 |
| 6,525,932 B1 | | 2/2003 | Ohnishi et al. |
| 6,661,648 B1 | * | 12/2003 | Dayley ....................... 361/686 |
| 2002/0008497 A1 | * | 1/2002 | Tanaka et al. .............. 320/128 |
| 2002/0030970 A1 | * | 3/2002 | Kim ............................ 361/686 |

* cited by examiner

*Primary Examiner*—Lisa Lea-Edmonds
(74) *Attorney, Agent, or Firm*—Jeffrey D. Moy; Harry M. Weiss; Weiss & Moy, P.C.

(57) ABSTRACT

A modular computer system (10) and components (12, 14, 16, 18, 20, 22, 24, 26) for use therein.

13 Claims, 8 Drawing Sheets

MODULAR COMPUTER SYSTEM AND COMPONENTS THEREFOR

CROSS REFERENCES TO RELATED APPLICATIONS

This application claims the benefit of U.S. Provisional Application No. 60/402,736 filed on Aug. 12, 2002.

BACKGROUND OF THE INVENTION

1. Field of the Invention

The present invention relates to computer component housing systems and components therefore. More particularly, the invention relates to modular computer systems and compatible components for easy upgradeability.

2. Description of the Prior Art

As purchased, computer systems often do not satisfy the individual needs of the consumer for any appreciable length of time. Therefore, it is frequently desirable to upgrade existing components and add features, such as upgrading the processor, adding more memory, upgrading the graphics capability, upgrading the sound capability, or adding a larger hard drive to an existing personal computer.

For most people, adding features to computer systems is not an easy task and carries with it chances of completing the task improperly. To add a feature or upgrade to a typical computer system, one must disconnect any external cables connected to the computer, remove back panel screws from the computer in order to remove the computer cover, remove the cover (thus, exposing the internal components), remove the slot cover covering the slot into which a hardware card will be installed, then insert the hardware card into the exposed slot. When handling the hardware card, one must be careful not to touch the components of the circuit board or to allow static damage of memory chips. Additionally, with hard drives or removable media drives one must also deal with power supply cables, ribbon cables, and hardware switch settings. Then, to complete the task, one must replace the computer cover, replace the screws, and reconnect any external cables previously disconnected.

It can be seen that the procedure for such additions or upgrading of current computer systems is time-consuming, cumbersome, and risky with respect to exposing internal computer components to the environment (dust, static, possible liquid spillage, etc.), with respect to the handling of the hardware card's circuitry, and with respect to making any necessary cable connections and switch settings correctly. Furthermore, there is usually a limit to the number of hardware cards and drives that may be added to a personal computer because of the limited number of slots available on the motherboard and the limited number of bays on the chassis.

Current computer systems typically include a motherboard. The motherboard may be sufficient and state-of-the-art when the computer system is purchased; however, as technology advances, the processor and/or the memory may become obsolete. To an extent, a computer system may be upgraded by attaching upgrading cards to the computer. However, there comes a limit to how much upgrading is possible with current computer systems. Often times, a computer system becomes obsolete, as it cannot meet the requirements of new software or cannot perform work competitive with newer computer systems. This is when the computer system is seen as "disposable" and needs to be replaced every few years.

In view of these problems, it is evident that there is a need for an improved computer system which is easily upgraded or to which additional hardware is easily added with minimal limitations. Therefore, the present invention seeks to provide a computer system and related components for easily and safely adding features to, repairing, customizing, expanding, updating or upgrading the hardware of a PC that reduces the chance of harming the circuitry on the hardware add-on device and that has the capability of increasing the number of hardware add-ons that may be attached to the computer.

It would be of a great advantage to the computer industry if there was provided a modular computer component housing system that allowed for easy upgradeability of components. Other advantages of the present invention will be readily appreciated, as the same becomes better understood after reading the subsequent description taken in conjunction with the appendant drawings.

SUMMARY OF THE INVENTION

In accordance with the above-noted advantages and desires of the industry, the present invention provides an interconnectable modular computer component system that includes at least one linking module including at least one central data or electrical connector that can act as the interconnector for at least one interchangeable hardware module for housing at least one computer component. The hardware modules include complementary connectors such that the data or electrical connector of the linking module may receive the complementary data or electrical connectors of the various hardware modules to create data and/or electrical communication between the computer component of the hardware module and the linking module.

By utilizing various modules for each of the computer components, such as the processor, the memory, the video/graphics card, the sound card, the hard drive, the DVD and/or the power supply, they can be stacked on one another and interconnected through a central link module to create a complete computer. That way, when the computer needs to be upgraded or repaired, one can merely remove the old module, and "plug" in a new replacement computer component. The electrical and/or data connection can be made to the link module, and the computer will be upgraded or repaired almost instantly.

One specific preferred embodiment has certain features including a stackable clamshell arrangement for housing the various computer components. These components are then all connected to one another through a link module that acts as a central electrical or data connector between the various components. It is also envisioned that the connections may be made through some other means than electrical, i.e. fiber optics, radio waves or infrared connections.

By these disclosures, one can see that a fully modular and interconnectable computer system can be achieved that is particularly useful for applications of civilian office and military computer installations that constantly require upgrading or repair. It is well known in the art that conventional computers can only be upgraded so much before the case can no longer hold all the components, or there aren't enough electrical connectors to incorporate new components. Consequently, the conventional computer systems have a built-in obsolescence. The present invention would alleviate such a problem, and provide a long life for the computer as it was constructed by the user.

Although the invention will be described by way of examples hereinbelow for specific embodiments having certain features, it must also be realized that minor modifications that do not require undo experimentation on the part of the practitioner are covered within the scope and breadth of this invention. Additional advantages and other novel features of the present invention will be set forth in the description that follows and in particular will be apparent to those skilled in the art upon examination or may be learned within the practice of the invention. Therefore, the invention is capable of many other different embodiments and its details are capable of modifications of various aspects which will be obvious to those of ordinary skill in the art all without departing from the spirit of the present invention. Accordingly, the rest of the description will be regarded as illustrative rather than restrictive.

BRIEF DESCRIPTION OF THE DRAWINGS

For a further understanding of the nature and advantages of the expected scope and various embodiments of the present invention, reference shall be made to the following detailed description, and when taken in conjunction with the accompanying drawings, in which like parts are given the same reference numerals, and wherein.

DETAILED DESCRIPTION OF THE INVENTION

For the purpose of promoting an understanding of the principles of the invention, reference will now be made to the embodiments illustrated in the drawings. Specific language will be used to describe the embodiments. It will, nevertheless, be understood that no limitation of the scope of the invention is thereby intended, and that alterations and further modifications in the illustrated devices, and further applications of the principles of the invention as illustrated herein may be contemplated as would normally occur to one skilled in the art to which the invention relates.

The present invention will be more completely understood through the following detailed description that should be read in conjunction with the attached drawings in which similar reference numbers indicate similar structures. Furthermore, it should be noted that terms, such as "back," "front," "top," "bottom," "vertical," "horizontal," and the like, are used herein only to facilitate the description of the structure of the invention as illustrated. It will be evident that the invention may be used in several different orientations.

As described above and hereinbelow, the terms PC, PC system, personal computer, computer, and computer system are used interchangeably. After reading the subsequent description, it will become immediately apparent to someone skilled in the art that the present invention is pertinent to all computer systems, regardless of their nomenclature, application, and size, including desktops, workstations, enterprise class systems, servers, mainframes, embedded systems, notebooks, laptops, mobiles, handhelds, palmtops, and pocket PCs. The creation of computer systems with other configurations, applications, and nomenclature would not impair or circumvent the spirit of the present invention.

The present invention, as will be described below, involves a user-assembled collection of encased hardware modules designed to enable interconnect ability, resulting in an accessible, modular, possibly frameless or chassis-less (i.e. having no case) computer system. Each of the encased hardware modules of the present invention has primary hardware along with the necessary controller/connection circuitry and is enclosed in protective housing which may be suitable for structural support as well as easy repetitive interconnection or "plug-ability". Even though the computer systems of the present invention may be frameless or chassis-less, it may be desirable for the consumer or designer to retain the frame or chassis and including such a frame or chassis would not detract from the spirit of the present invention.

Figure 1:
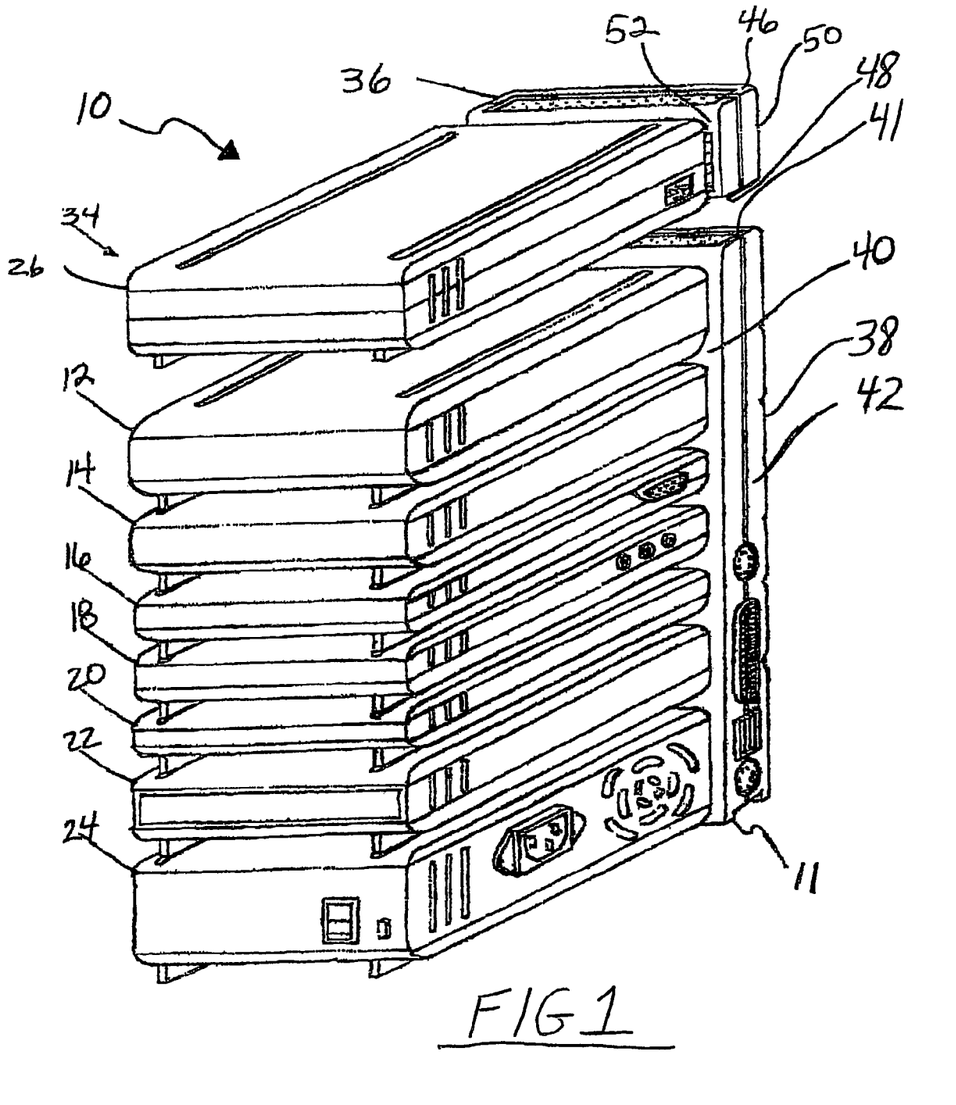
FIG. 1 is a perspective view of the back of a computer system according to the present invention, the computer system including a link module, an expansion link module, and several hardware modules.

Now, referring to the drawings, FIG. 1 shows a perspective view of the back of an embodiment of the present invention, computer system 10, which includes link module 11, various encased hardware modules 12–26 (even-numbered reference numerals), and expansion link module 36. Link module 11 has front side 38 (cannot be seen in FIG. 1), back side 40, top side 41, and two vertical sides including vertical side 42. Back side 40 of link module 11 has several slots (not seen in FIG. 1) into which the hardware modules are inserted.

The rectangular hardware modules inserted into link module 11 are processor module 12, memory module 14, video/graphics module 16, sound module 18, hard drive module 20, DVD/read-write drive module 22, and power supply module 24. Link module 11, processor module 12, and memory module 14, together basically replace what is commonly used in current computer systems and referred to as the "motherboard". Link module 11 is basically a "connector board" to which the processor module and the memory module are connected. In this invention, it is easier to upgrade the processor and/or the memory of the computer system by simply replacing the processor module and/or the memory module with upgraded modules. The level of upgrading is less limiting than upgrading a conventional motherboard.

However, although the computer systems depicted in the Figures reconfigures and compartmentalizes the elements of a standard motherboard to the extent that a standard motherboard is eliminated in these computer systems, it would be apparent to someone skilled in the art that it is not necessary to reconfigure the standard motherboard in order to deliver a modular computer system that reflects the spirit of the invention. In other words, the standard motherboard may remain as it is conventionally, but the added hardware may be made modular according to the present invention. The modular hardware would continue to offer the advantages as discussed herein.

Expansion link module 36 has top side 46, bottom side 48, front side 50 (not seen) and back side 52. Bottom side 48 is attachable to top side 41 of link module 11 in such a way as to have electrical and data connection between link module 11 and expansion link module 36. Expansion link module 36 and any other desired expansion link modules are provided to enable the attachment of more hardware modules, in the event, that the slots in link module 11 do not have enough connections and/or the types of connections desired. For example, a slot for a modem module is not available on link module 11; however, a slot is available for modem module 26 in expansion link module 36.

The link modules, the expansion link modules, and the hardware modules of the present invention are encased in rigid material for the protection of the internal electronics, to allow convenient handling of the modules without damaging internal components, and to provide structural support to the computer system and its components. The rigid material may be, for example, plastic, composite, metal, ceramic, and/or glass and the like, and the components of the encasements may be held together with fasteners or bonded together as one piece in the manufacturing process or held together using any other technique known in the manufacturing art.

Figure 2:
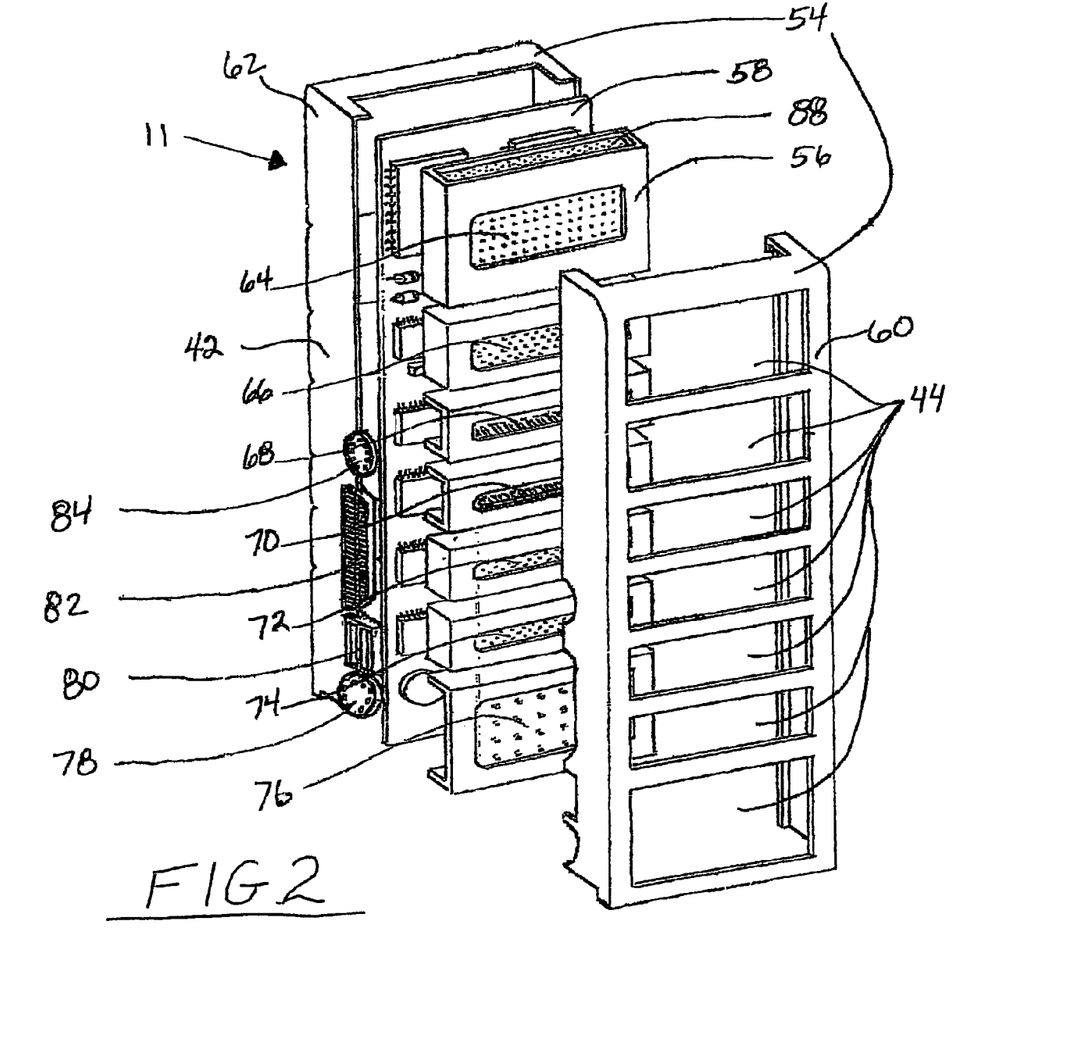
FIG. 2 is a front exploded perspective view of a link module according to the present invention.

Now referring to FIG. 2, link module 11 is shown in front exploded perspective view having exterior encasement 54, connector encasement 56, and link circuit board 58. Exterior encasement 54 is of a clamshell design and includes front encasement 60 and back encasement 62.

Connector encasement 56 houses the connectors for the hardware modules, that is, processor module connector 64, memory module connector 66, video/graphics module connector 68, sound module connector 70, hard drive module connector 72, DVD/read-write drive module connector 74, and power supply module connector 76. Slots 44 through front encasement 60 correspond in position to each of the various connectors.

Back encasement 62 of link module 11 also has various connectors for standard peripheral devices on vertical side 42. The various connectors include keyboard connector 78, two USB ports 80, printer connector 82, and mouse connector 84. The various connector ports are merely exemplary, as the types of connector ports may vary. Female connector 88 at the top of connector encasement 56 is provided for the attachment of expansion link module 36 shown in FIG. 1.

Figure 3:
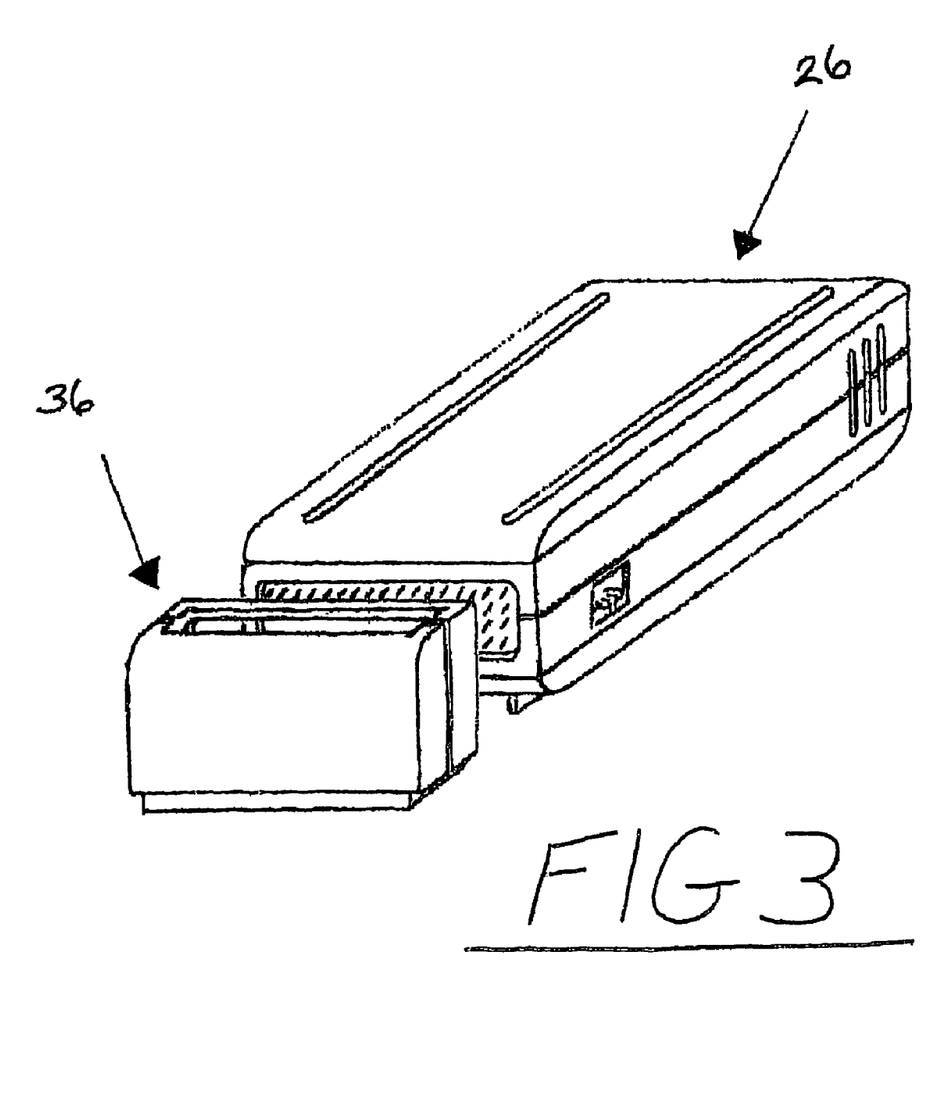
FIG. 3 is a back perspective view of an expansion link module and a hardware module according to the present invention.

Now referring to FIG. 3, a back perspective view of hardware module 26 and expansion link module 36 is shown. Hardware module 26 is shown aligned with expansion link module 36, but not yet connected to it.

Figure 4:
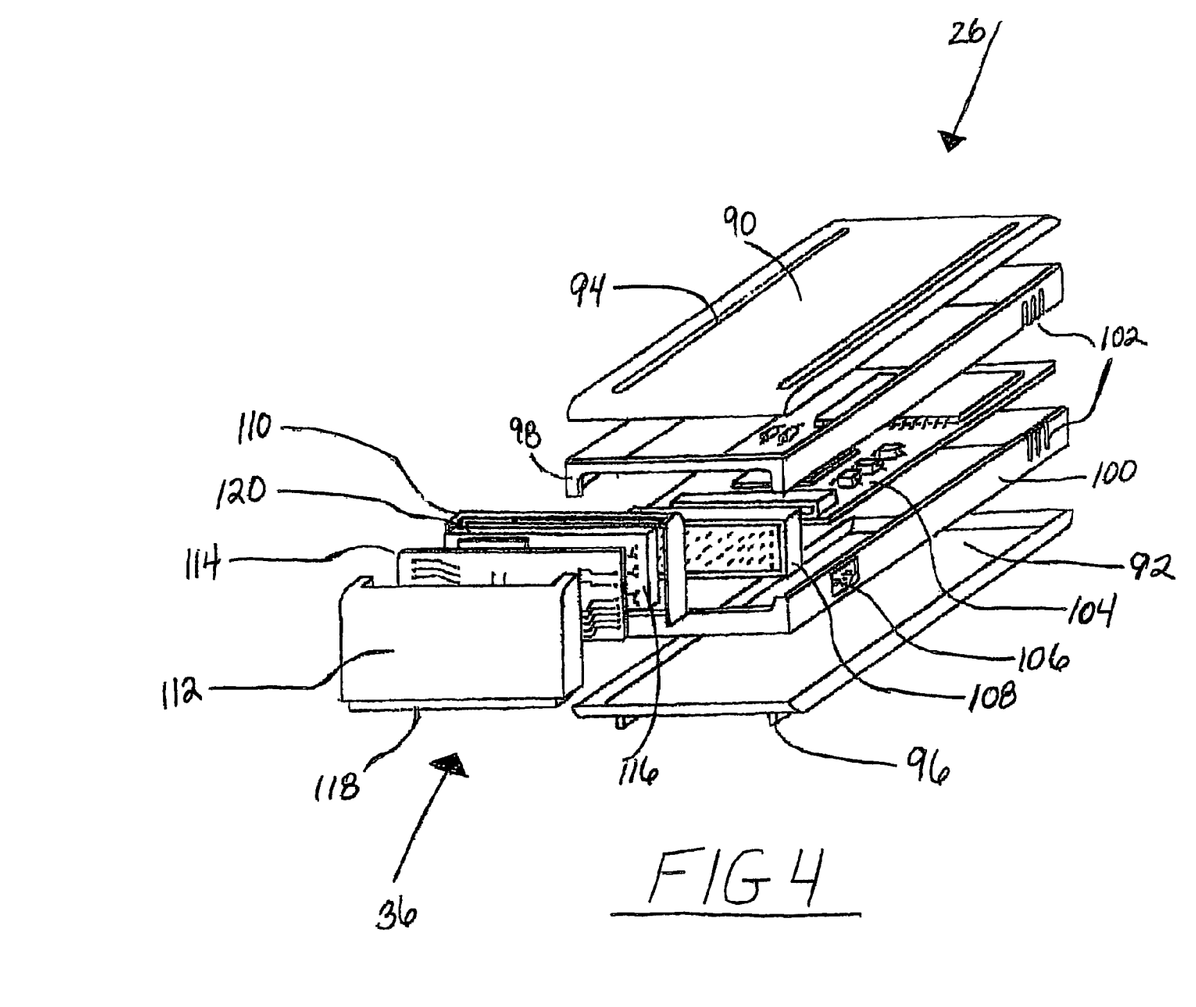
FIG. 4 is an exploded front perspective view of the components shown in FIG. 3.

Turning now to FIG. 4, an exploded front perspective view of hardware module 26 and expansion link module 36 is shown. Hardware module 26 includes a clamshell-designed encasement which has top encasement 90 and bottom encasement 92. Top encasement 90 has elongated concave foot rail guides 94, and bottom encasement 92 has elongated protruding foot rails 96. The foot rails and foot rail guides enable other hardware modules to be slid into place above or below hardware module 26 and help to maintain the hardware modules secure in position.

Hardware module 26 also includes top and bottom expansion spacers 98 and 100, each of which have encasement vents 102, and modem card 104, standard RJ11 modem phone jack 106, and male PCI connector 108. PCI connector 108 protrudes from the end of the encasement and provides means for plugging hardware module 26 to be plugged into expansion link module 36. Although connector 108 is depicted as a PCI connector, it should be understood that this "interconnect" connector may be any type of connector or connecting method, including wireless technologies, conforming to any applicable standard, both those current and those developed in the future (such as the forthcoming PCI Express standard) so long as it meets the data transfer requirement.

Expansion link module 36 includes an encasement of clamshell design which includes front encasement 110, back encasement 112, link board 114, female PCI-type connector 116, male link board connector 118, and a female link board connector 120.

Figure 5:
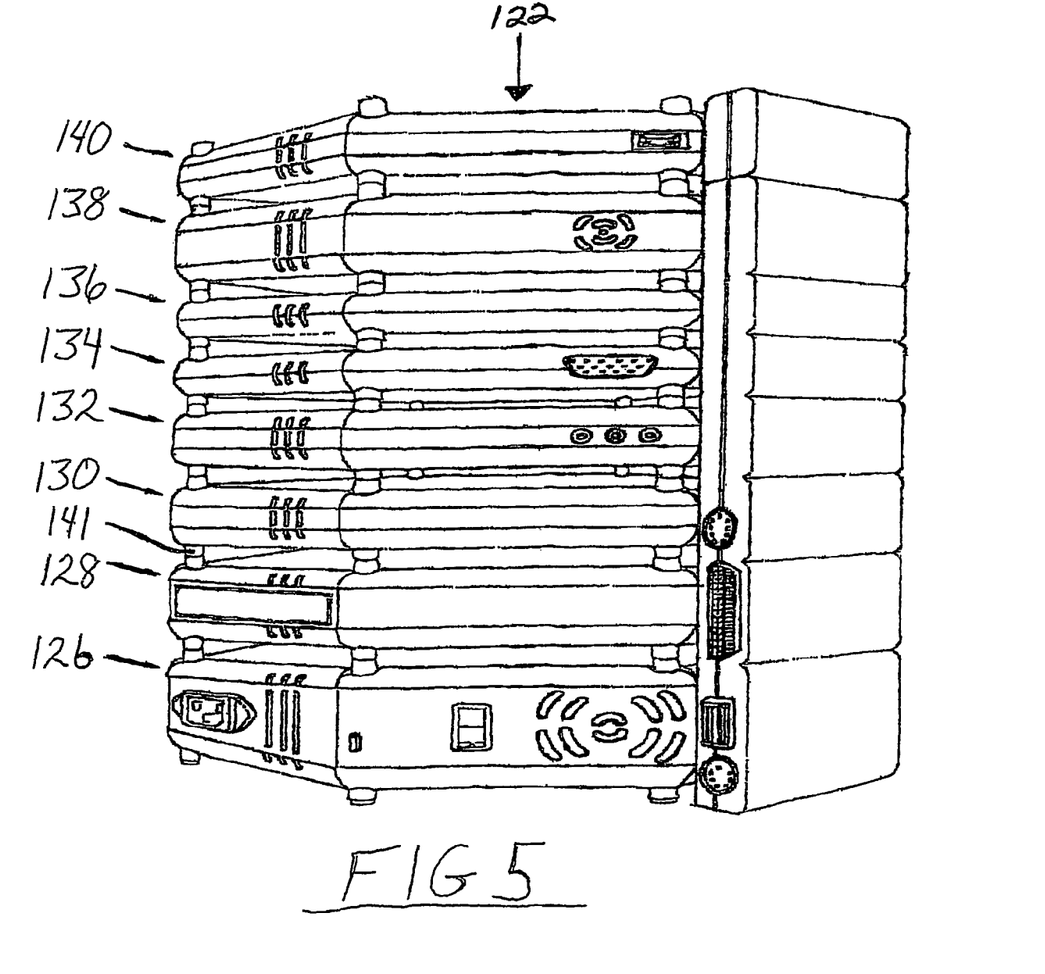
FIG. 5 is a perspective view of another computer system according to the present invention.
Figure 6:
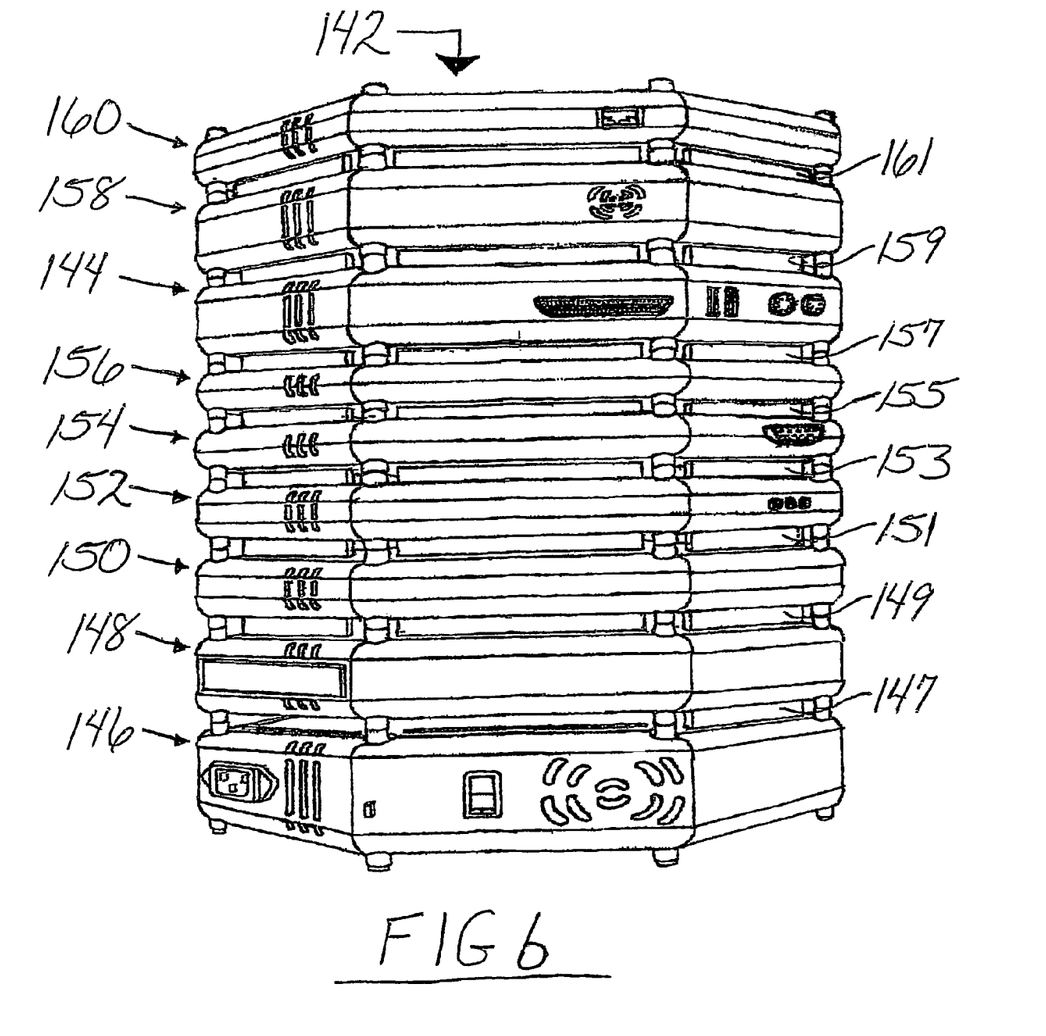
FIG. 6 is a perspective view of yet another computer system according to the present invention.

FIG. 5 illustrates another embodiment of the present invention, computer system 122, which includes link module 11 and various hardware modules 126–140 (even-numbered reference numerals). Hardware modules 126–140 have a hexagonal shape as best seen in FIG. 6 rather than the generally rectangular shape of the hardware modules in FIGS. 1, 3 and 4. Computer system 122 illustrates the fact that the shape of the hardware modules does not affect the spirit of the invention. Additionally, the shape and order of the hardware module ports arranged on the link module need not conform to the shape and order as shown in the Figures, even though the specific link modules shown are designed for connection to a specific hardware order.

In FIG. 5, the hardware modules are, from the bottom up, power supply module 126, DVD read/write CD drive module 128, hard drive module 130, sound module 132, video/graphics module 134, memory module 136, processor module 138, and optional modem module 140. There are spaces between the various hardware modules which are created by legs 141 of the modules. Hardware modules 126–140 are shown "plugged" together to form a user-configured computer system.

FIG. 6 shows a perspective view of yet another embodiment of the present invention, computer system 142. In this embodiment, the link module (144) is an in-line link module. Each of the individual hardware modules (146–160) are connected internally to in-line link module 144. In this embodiment, from the bottom up, the hardware modules are: power supply module 146 with its male connector 147, DVD read/write CD Drive module 148 with its male connector 149, hard drive module 150 with its male connector 151, sound module 152 with its male connector 153, video/graphics module 154 with its male connector 155, memory module 156 with its male connector 157, processor module 158 with its male connector 159, and modem module 160 with its male connector 161. Link module 144 has all female internal connectors (not shown in FIG. 6).

Figure 7:
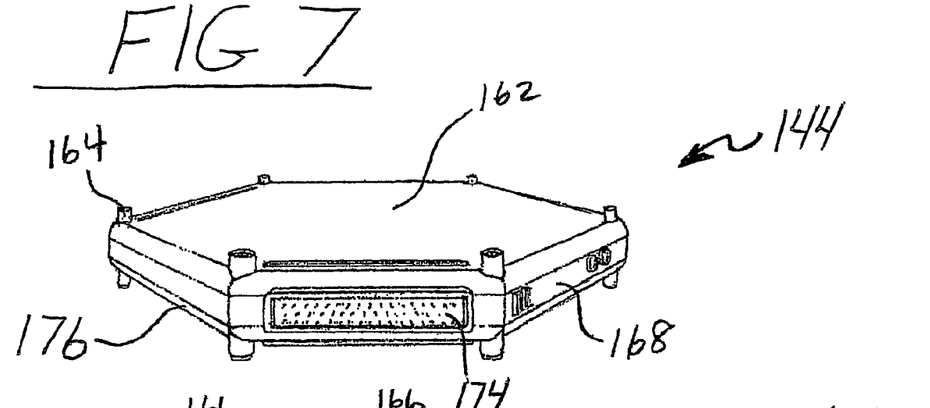
FIG. 7 is a perspective view of a link module according to the present invention.
Figure 8:
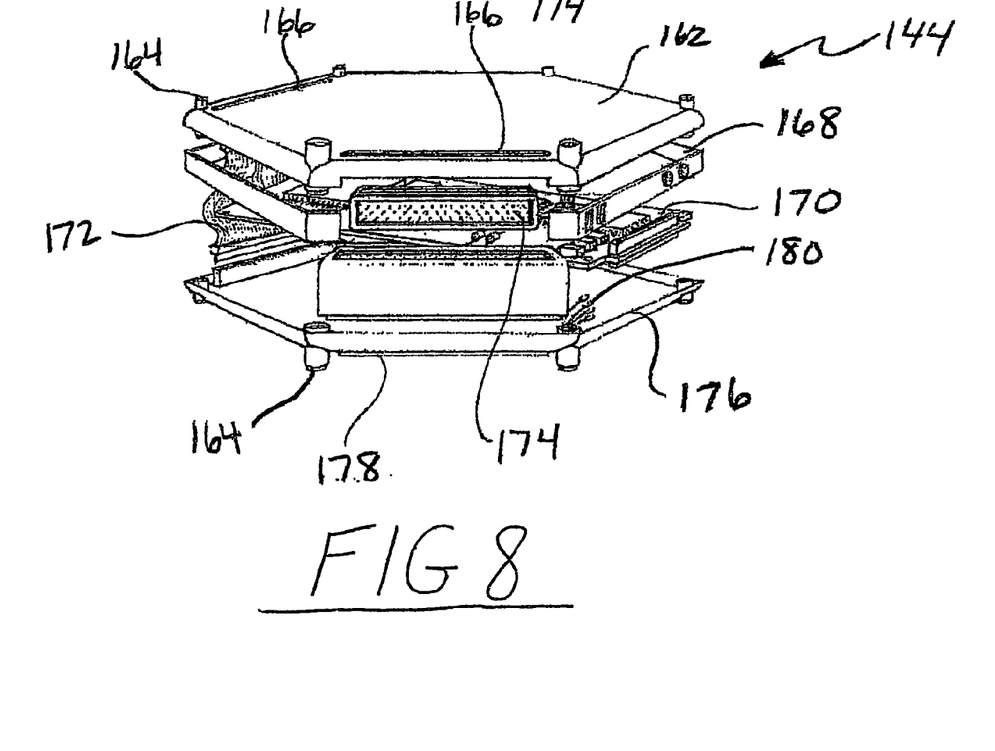
FIG. 8 is an exploded perspective view of the link module shown in FIG. 7.

FIG. 7 shows a perspective view of link module 144, and FIG. 8 shows an exploded perspective view of link module 144. Link module 144 includes top encasement 162 with leg connectors 164 and female connector 166, expander connection 168, hardware processor board 170, ribbon cable 172, external device port 174, and bottom encasement 176 with leg connectors 164 and male connector 178. Ribbon cable 172 is connectible to female connector 166 and to male connector 172 and allows for data transfer between modules. Electrical wires 180 extend through one of the leg connectors 164 and are present to allow connection to a power source for link module 144 and the hexagonal hardware modules, such as those shown in FIG. 6.

Figure 9:
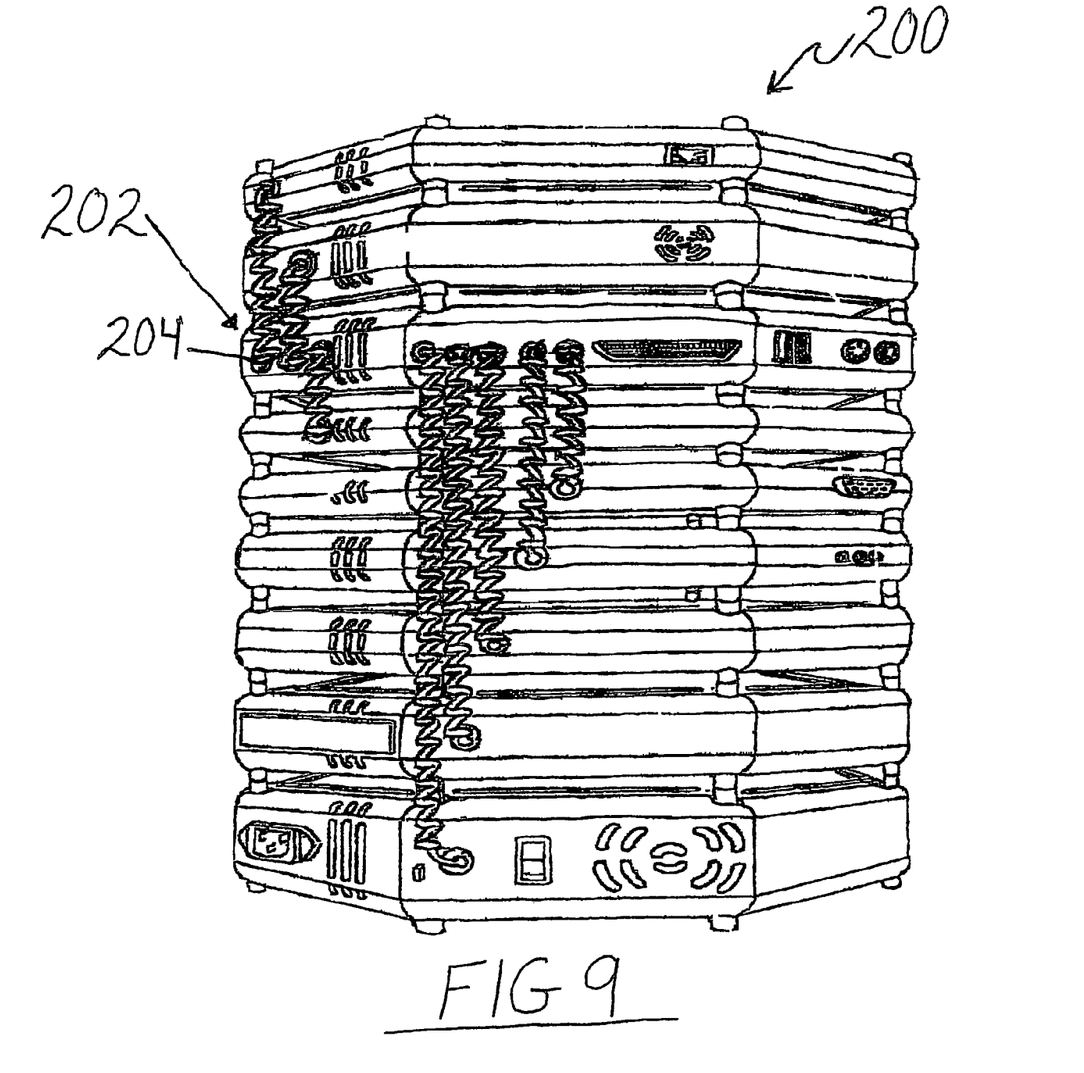
FIG. 9 shows yet another computer system according to the present invention.

FIG. 9 shows still another embodiment of the present invention, computer system 200. Computer system 200 is similar to computer system 142 shown in FIG. 6; however, computer system 200 has external connections between its in-line link module (202) and the hardware modules. The external connection is provided by external cabling 204 which connects each hardware module to in-line link module 202. A unique feature of the design shown in FIG. 9 is that the modules do not have to be stacked. Rather, the modules may be arranged in the same plane (e.g., horizontally or vertically) or some may be stacked and others not stacked. This feature is possible because of the flexible cabling that extends from the link module to the various hardware modules.

To use the present invention, a user desiring to assemble a computer system would have available at least one link module and the necessary hardware modules for making a computer system. At the present time, it is generally considered that the necessary hardware modules include a processor module, a memory module, a video/graphics module, a sound module, a hard drive module, a read-write drive module, and a power supply module. The user would then plug the various hardware modules into the link module as appropriate according to the specific design of the computer system. Thereafter, peripheral devices, such as a monitor, a keyboard, a mouse, and a printer, are plugged into the link module, and the link module is then plugged into a power source (e.g., an electrical outlet). The computer system is then ready for typical use.

However, to someone skilled in the art, other unique configurations may be made incorporating some or all of the above-described minimum configuration of modules, but may include other configurations of modules such as a separate power supply module, a fully integrated game module, a high-end home theater module, a remote control module, an automotive module, a mobile module, or a network module, giving the user the ability to attach to dedicated gaming consoles, home entertainment systems, televisions, automated house control centers, automotive entertainment and GPS systems, mobile devices, other computer systems, or additional electronic devices on personal or local area networks.

In a variation of the present invention, the link module may include the processor and main memory, thus, being similar to a motherboard. The necessary hardware modules and the peripheral devices would then be plugged into the link module as discussed immediately hereinabove.

To upgrade or add to the above-described computer system, the user would simply attach an expansion link module to the current link module and install another hardware module into the added expansion link module.

Thus, having described the invention, it is presented that the invention provides a modular computer system (and related components) to which adding features, repairing, customizing, expanding, updating, and/or upgrading the hardware may be performed easily and safely and with less limitation than with current computer systems. With the modular computer system of the present invention, the addition of features, repairing, customizing, expanding, updating, and/or upgrading does not require the removal of the computer system cover or screws, decreases the chance of harming the circuitry on the hardware add-on device(s), enables the proper connection of the add-on device(s) without trial and error, has the capability of increasing the number of hardware devices that may be attached to the computer, and ultimately allows the computer system to keep better pace with future technology advancements. The present invention may be designed to include a traditional chassis or frame configuration while incorporating some or all of the modular components described herein. However, the inclusion of such a frame or chassis would not detract from the spirit of the present invention.

In summary, numerous benefits have been described which result from employing any or all of the concepts and the features of the various specific embodiments of the present invention, or those that are within the scope of the invention. The new computer system acts as a stackable and easily interchangeable computer.

The foregoing description of a preferred embodiment of the invention has been presented for purposes of illustration and description. It is not intended to be exhaustive or to limit the invention to the precise form disclosed. Obvious modifications or variations are possible in light of the above teachings with regards to the specific embodiments. The embodiment was chosen and described in order to best illustrate the principles of the invention and its practical applications to thereby enable one of ordinary skill in the art to best utilize the invention in various embodiments and with various modifications as are suited to the particular use contemplated. It is intended that the scope of the invention be defined by the claims which are appended hereto.

INDUSTRIAL APPLICABILITY

The present invention finds particular industrial applicability in the computer industry, and is especially useful in civilian and military office environments requiring readily upgradeable computer systems.

What is claimed is:

1. A modular computer component system, comprising:
at least one linking module including at least one central data connector;
at least one interchangeable hardware module for housing at least one computer component, said hardware module including complementary connectors such that the at least one data connector of the linking module may receive the complementary data connectors of the hardware module to create data communication between the computer component of the hardware module and the linking module;
whereby said at least one linking module acts as at least a part of a central data connector into which the at least one hardware modules can be placed into communication with the linking module, such that each hardware module can be easily interchanged and connected for upgrading and repair without undue effort;
whereby a complete computer system is created by linking together different interchangeable hardware modules that replace a motherboard by combining utility specific components selected from the group comprising of a processor, hard drive, memory, graphic card, sound card, power supply, and data storage devices.

2. The system of claim 1, wherein the at least one linking module acts as a central connector for all other modules to be connected to, and shall include a sufficient number of connectors to accommodate a number of hardware modules to be received thereby.

3. The system of claim 1, wherein the central data connector of the linking module may include connectors selected from the group consisting of electrical connectors, radio frequency remote connectors, infra-red connectors, hardwire connectors, ribbon electrical connectors, and fiber optic communication connectors.

4. The system of claim 1, further comprising an expansion linking module for connection to the linking module if more capacity is needed than is available on the linking module.

5. The system of claim 1, wherein the at least one linking module and the at least one hardware module are encased in rigid material.

6. The system of claim 1, wherein the at least one linking module and the at least one hardware module are physically connectable such that a fully capable computer may be constructed through the interconnection of the modules.

7. The system of claim 1, wherein the linking module further comprises various connectors for standard peripheral devices selected from the group consisting of keyboards, USB ports, printer connections, mouse connectors, and other standard devices.

8. The system of claim 1, wherein each interchangeable hardware module may include a clamshell design of a rigid material for housing computer components, whereby the individual interchangeable hardware modules may be located proximate to one another.

9. A modular computer component system, comprising:
   at least one linking module including a central electrical connector; and
   at least one interchangeable hardware module for housing at least one computer component, said hardware module including complementary electrical connectors such that the electrical connectors of the linking module may receive the complementary electrical connectors of the hardware module to create electrical communication between the computer component of the hardware module and the linking module;
   whereby a complete computer system is created by linking together interchangeable hardware modules, a plurality of interchangeable hardware modules comprising individual components that collectively replace a motherboard together with additional functional interchangeable hardware modules.

10. The system of claim 9, wherein the at least one linking module acts as a central electrical connector for all other modules to be connected to, and shall include a sufficient number of electrical connectors to accommodate a number of hardware modules to be received thereby.

11. The system of claim 9, further comprising an expansion linking module for electrical connection to the linking module if more capacity is needed than is available on the linking module.

12. The system of claim 9, wherein the at least one linking module and the at least one hardware module are encased in rigid material.

13. The system of claim 9, wherein the at least one linking module and the at least one hardware module are physically connectable such that a fully capable computer may be constructed through the interconnection of the modules.

\* \* \* \* \*